US006496093B2

(12) United States Patent
Compter et al.

(10) Patent No.: US 6,496,093 B2
(45) Date of Patent: Dec. 17, 2002

(54) DISPLACEMENT DEVICE

(75) Inventors: Johan Cornelis Compter, Eindhoven (NL); Petrus Carolus Maria Frissen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/861,937

(22) Filed: May 21, 2001

(65) Prior Publication Data

US 2002/0000904 A1 Jan. 3, 2002

(30) Foreign Application Priority Data

May 23, 2000 (EP) .............................. 00201835

(51) Int. Cl.[7] ................................. H01F 7/00
(52) U.S. Cl. ......................... 335/229; 335/220; 310/13
(58) Field of Search ................. 335/220–221, 335/228–232, 236; 310/12–14; 318/135

(56) References Cited

U.S. PATENT DOCUMENTS

| 3,376,578 A | | 4/1968 | Sawyer | |
|---|---|---|---|---|
| 3,585,423 A | * | 6/1971 | Bolton et al. | 310/12 |
| 4,535,278 A | | 8/1985 | Asakawa | |
| 4,581,553 A | * | 4/1986 | Moczala | 310/12 |
| 4,654,571 A | | 3/1987 | Hinds | |
| 5,696,411 A | * | 12/1997 | Takei | 310/12 |
| 5,886,432 A | | 3/1999 | Markle | |

FOREIGN PATENT DOCUMENTS

WO  WO0118944  1/1915

* cited by examiner

*Primary Examiner*—Lincoln Donovan
(74) *Attorney, Agent, or Firm*—Aaron Waxler

(57) ABSTRACT

Positioning device with a first part and a second part which are movable relative to each other in at least one direction. Said first part comprises a carrier on which a system of magnets with N and Z magnets are arranged in an alternating manner and having a flux density $B(x)=B(x+2\tau)$, $\tau$ being the magnetic pole pitch. Said second part comprises an electric coil system with at least one coil block unit, each unit having k coil blocks with k]2, said coil blocks having conductors, all conductors belonging to the same coil block being oriented in the same direction and fed by a n-phase system with n]2. Seen in a direction perpendicular to the conductors, the flux varies according to $$\Phi = \sin\frac{\pi(x+x_0)}{2\tau}.$$

Figure 1:
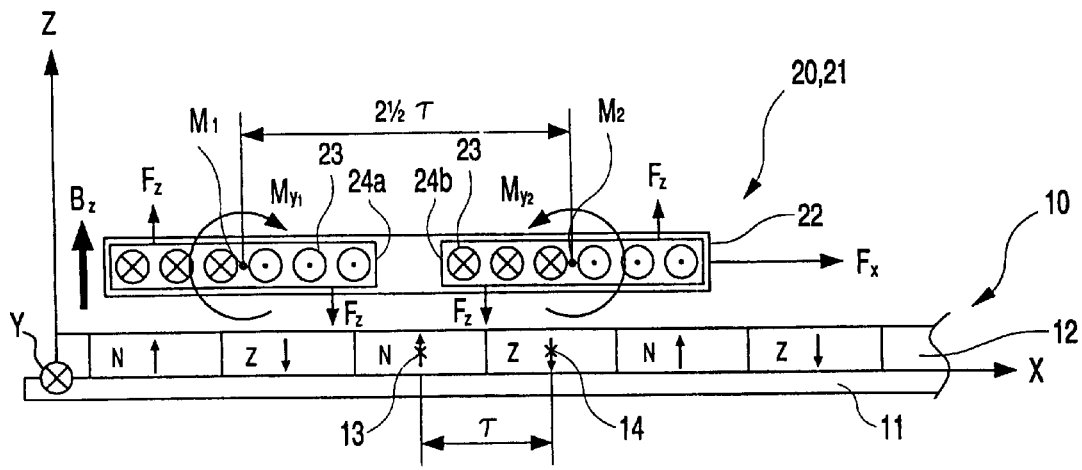

During the desired movement of the parts relative to each other, there is a small undesired up and down movement perpendicular to the desired movement. To avoid this undesired movement, the distance between the mass centers of the coil blocks belonging to a coil block unit, seen in a direction perpendicular to the conductors, is equal to $$\frac{\tau}{k} + p \times \tau,$$

with p=2, 3 . . . .

4 Claims, 3 Drawing Sheets

DISPLACEMENT DEVICE

The invention relates to a displacement device with a first part and a second part which are displaceable relative to one another in at least one direction (x), said first part comprising a carrier which extends substantially parallel to the displacement direction and on which a system of magnets is fastened in accordance with a pattern whereby magnets of a first kind (N) with a magnetization direction perpendicular to the carrier and directed towards the second part and magnets of a second kind (Z) with a magnetization direction perpendicular to the carrier and directed away from the second part are arranged so as to alternate with one another, which system of magnets has a magnetic flux density which repeats itself periodically in accordance with B(x)=B(x+2τ), in which τ is the magnetic pole pitch, while the second part is provided with an electric coil system with at least one coil block unit comprising k coil blocks, with k≧2, which coil blocks have current conductors which are situated in a magnetic field of the system of magnets, all current conductors belonging to one coil block unit being oriented in the same direction and being fed by an n-phase system, with n≧2, while furthermore the magnets of the magnetic system are arranged such that, viewed in a direction perpendicular to the current conductors, the flux of the magnetic system varies substantially sinusoidally in accordance with $$\Phi = \sin\frac{\pi(x+x_0)}{2\tau}.$$

Such a displacement device is known from U.S. Pat. No. 4,654,571. This displacement device is used in a lithographic device (wafer stepper) for the manufacture of semiconductors. Said second part with the electric coil system is the part moving in the X-Y plane in this case. A problem in such displacement devices is that, during the displacement of the moving part, this part is subject to changing forces in the Z-direction, so that a continuously varying torque will be exerted on the moving part about an axis lying in the X-Y plane. This causes an additional rocking movement which adversely affects the displacement accuracy. It will be explained in more detail with reference to FIG. 8 what gives rise to this rocking movement. A situation is depicted in a linear arrangement for the sake of simplicity, i.e. a system of magnets 1 with N- and Z magnets alternating in the X-direction, while a coil block 2 with six current conductors 3 is present in the magnetic field, said current conductors being supplied by a 3-phase system. Such a system of magnets complies with the conditions mentioned in the first paragraph. The current conductors extend in the Y-direction, i.e. transversely to the direction of movement. The current conductors 3 are subject to a magnetic flux density which varies its direction and magnitude in dependence on their position. The vectors X, Y, and Z of the flux density have a sinusoidal gradient. When a current is passed through the current conductors, the flux density $B_z$ exerts a Lorentz force $F_x$ on the current conductors and accordingly on the coil block 2 in a direction perpendicular to the current conductors and the flux density, i.e. in the X-direction. It is possible to achieve a constant force $F_x$ through a correct distribution of currents in the conductors (commutation), and thus to obtain a controlled movement of the coil block. This current distribution, however, also leads to local $F_z$ forces whose sum is indeed zero in the end, but which do exert a torque $M_y$ on the current conductors 2. These local $F_z$ forces are the result of the occurring local values of the flux density $B_x$ and the local values of the currents through the conductors, for which it is true that $$B_x = \hat{B}_x \sin\frac{\pi x}{2\tau} \text{ and } I_{y,ph} = \hat{I}_{y,ph}\sin\left(\frac{\pi}{2\tau} + ph\frac{2\pi}{n} + \varphi\right).$$

Here ph is the number of the relevant phase, n is the number of phases with which the current conductors are supplied (in the example of FIG. 5: n=3), and ω is the phase angle (0–2π). The values of the local forces $F_z$ with respect to the mass center M of the coil block 2 change during the movement of the coil block in the X-direction. The magnitude of the torque thus changes continually and has a repetitive character. It is this torque which causes the undesired rocking effect on the coil block. It will be obvious that this adverse phenomenon will also arise in both directions X and Y when the system of magnets extends along the X-Y plane and the coil block can move in the X- and Y-direction, as is the case in U.S. Pat. No. 4,654,571.

It is an object of the invention to improve the displacement device as described in the opening paragraph such that said rocking effect during the displacement of the moving part in the X- and/or Y-direction does not occur any more or is at least as small as possible.

The displacement device is for this purpose characterized in that it is true for all coil blocks belonging to one coil block unit that the distance between mass centers of consecutive coil blocks, viewed in a direction perpendicular to the conductors, is substantially equal to $$\frac{\tau}{k} + p \times \tau,$$

with p=2, 3, . . .

The provision of equally oriented coil blocks with interspacings as indicated above in a coil block unit gives rise to torques $M_y$ on each coil block which are approximately of the same value, but oppositely directed, so that these torques cancel each other out as much as possible, and the rocking effect is minimized.

A preferred embodiment of the displacement device is characterized in that the parts are displaceable relative to one another in an X-direction, the magnets of the different kinds extending alternately and substantially exclusively in the X-direction, while the magnetic pole pitch τ is defined as the distance between center points of two mutually adjoining magnets of different kinds (N and Z), and the current conductors of the coil blocks are oriented substantially perpendicularly to the X-direction. The moving part is displaced exclusively in the X-direction in such an arrangement. This displacement device is also referred to as a linear motor.

If the moving part is to be capable of displacements both in the X- and in the Y-direction, the device is characterized in that the parts are displaceable relative to one another in an X-direction and/or in a Y-direction perpendicular to the X-direction, the magnets of the system of magnets of the first part being arranged in accordance with a pattern of rows and columns perpendicular thereto and enclosing an angle of approximately 45° with the X-direction, while magnets of a first kind (N) with a magnetization direction perpendicular to the carrier and directed towards the second part and magnets of a second kind (Z) with a magnetization direction perpendicular to the carrier and directed away from the second part are arranged in each row and in each column alternately, the magnetic pole pitch τ being defined as the distance between two mutually adjoining diagonal lines on which center points of magnets of the same kind (N or Z) are situated, and the coil system of the second part comprises at least two coil block units, current conductors of at least one of said coil block units being oriented in the X-direction and of the other coil block units in the Y-direction. Such a displacement device is also called a planar motor.

A further embodiment of the displacement device is characterized in that a magnet of a third kind (H) with a magnetization direction parallel to the X-Y plane and directed towards the magnet of the first kind (N) is present between each magnet of the first kind (N) and of the second kind (Z). The magnets are placed in a so-called Halbach arrangement here. Such an arrangement leads to an intensification of the magnetic field, so that the forces in the direction of movement are greater. A compensation of the $M_y$ torques takes place also in this arrangement.

The invention will now be explained in more detail with reference to a few embodiments.

Figure 2:
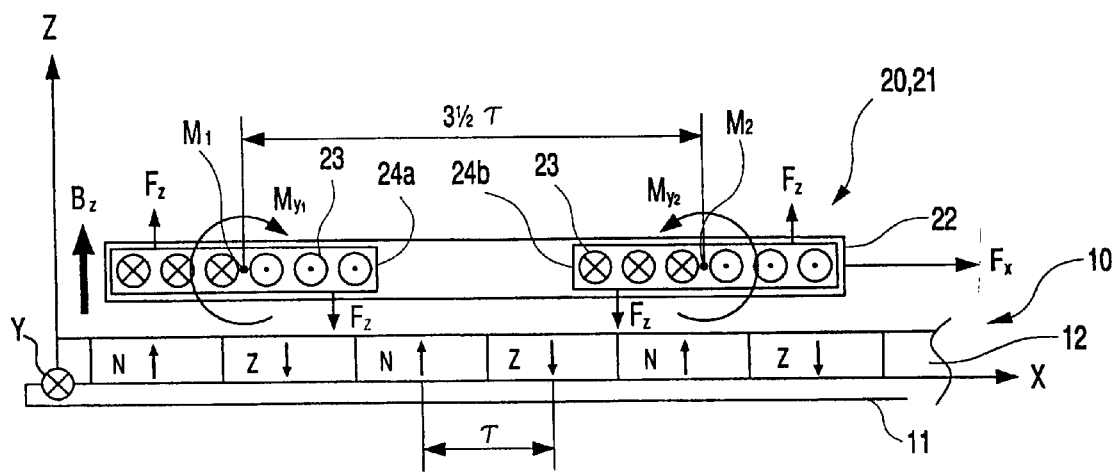
Figure 8:
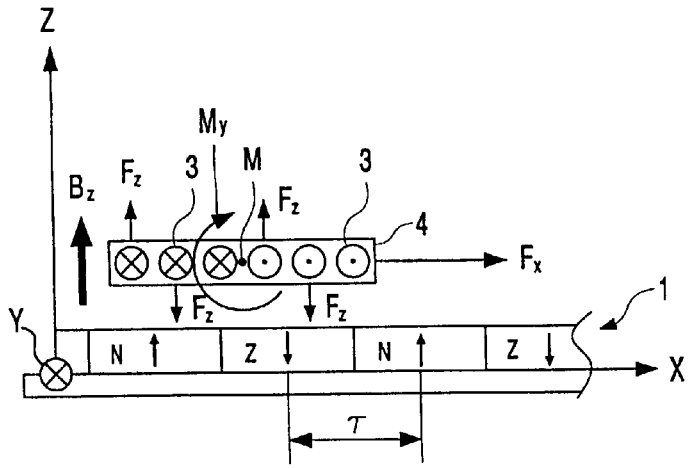
Figure 3:
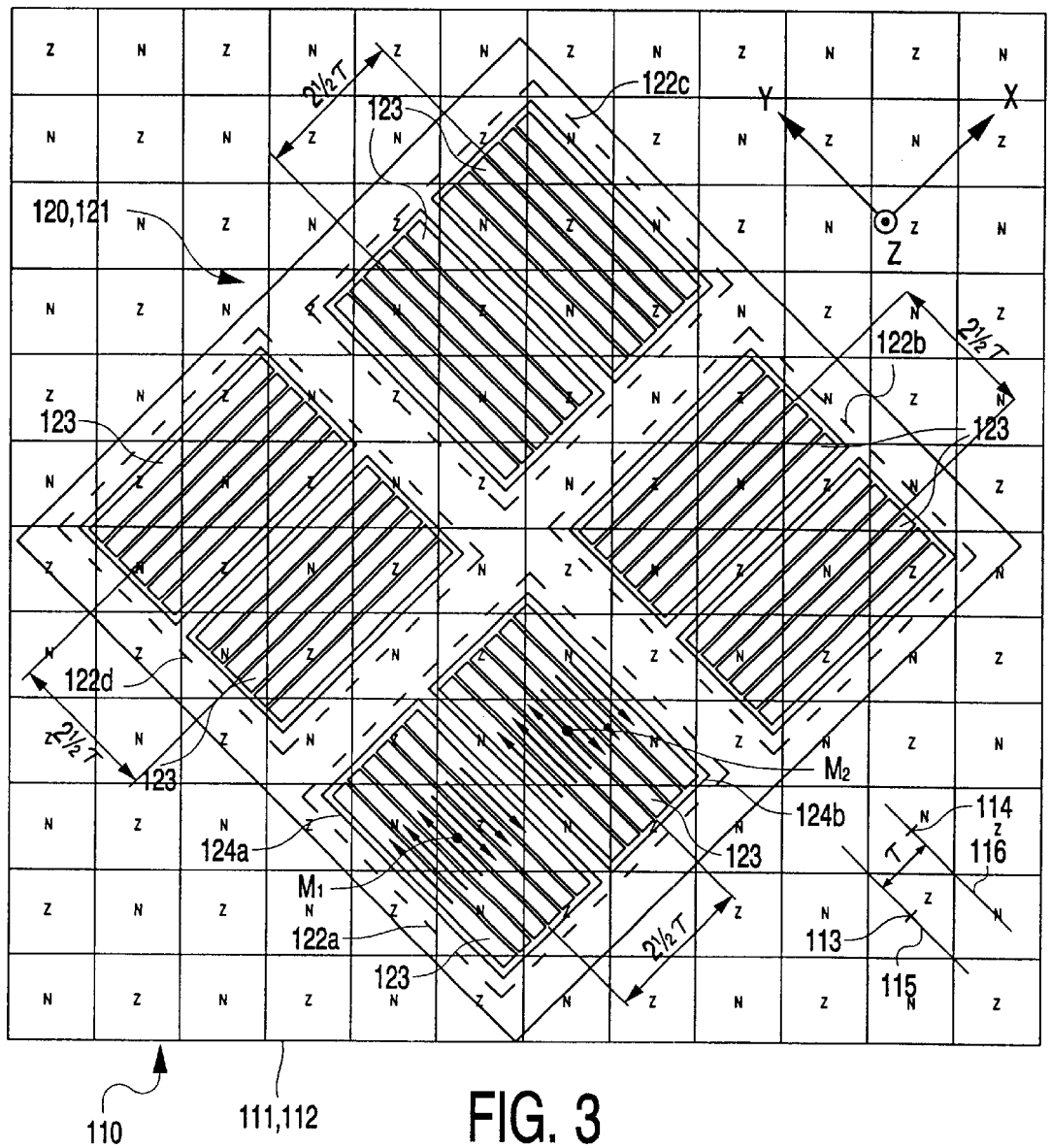
Figure 4:
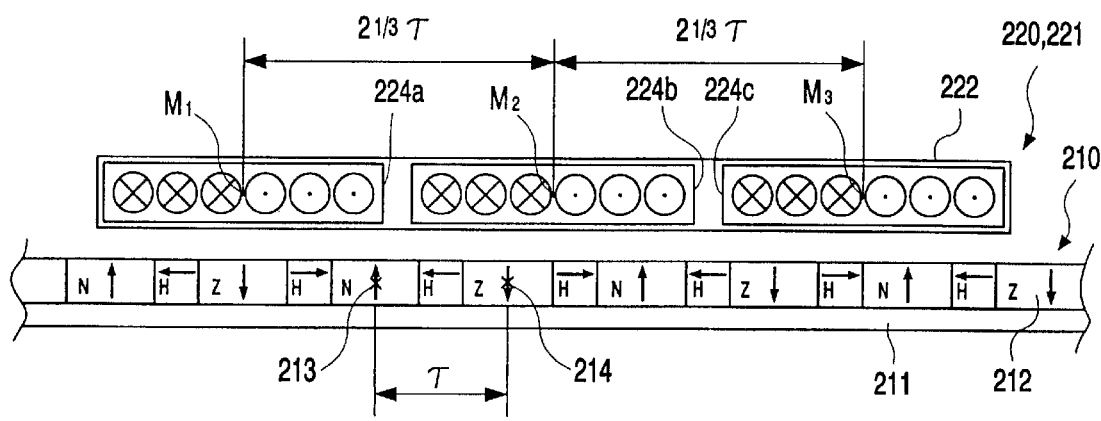
Figure 5:
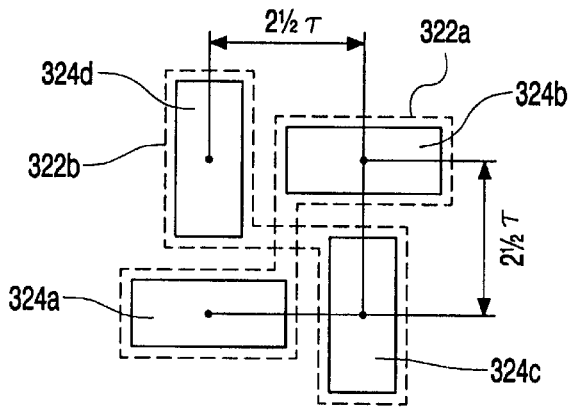
Figure 6:
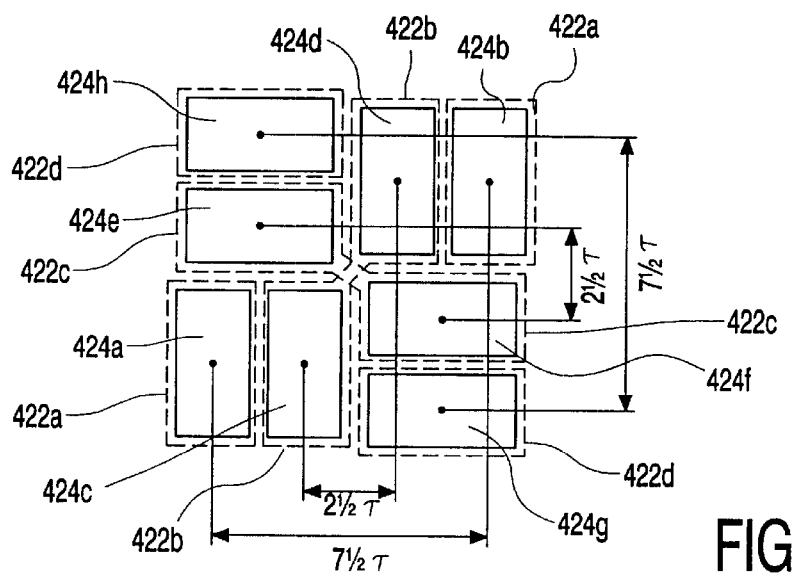
Figure 7:
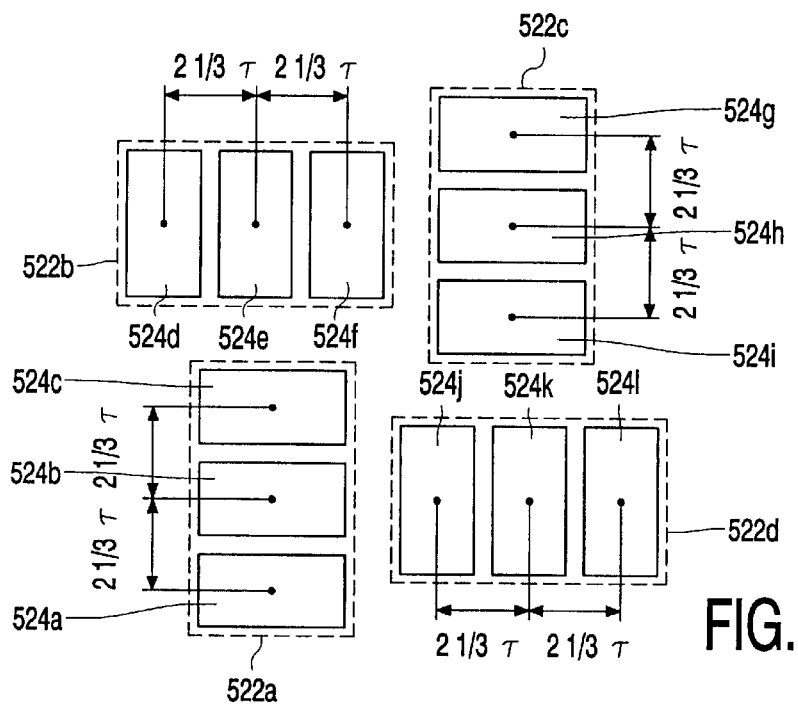

FIG. 1 diagrammatically shows a first linear displacement device according to the invention, FIG. 2 diagrammatically shows a second linear displacement device according to the invention, FIG. 3 is a diagrammatic plan view of a planar displacement device according to the invention, FIG. 4 diagrammatically shows a linear displacement device as in FIG. 2, but with a Halbach arrangement of magnets, FIGS. 5 to 7 diagrammatically show a number of coil block configurations, and FIG. 8 diagrammatically shows a displacement device according to the prior art.

The linear displacement device of FIG. 1 comprises a first part 10 and a second part 20 which are displaceable relative to one another in the X-direction. The first part 10 has a carrier 11 on which a system of magnets 12 is fastened. The N and Z magnets of the system alternate with one another and extend in the X-direction. The second part 20 is formed by a system of electric coils 21 with a coil block unit 22 which in this example comprises two coil blocks 24a and 24b. Each coil block 24a, 24b is provided with six current conductors 23 which are present in the magnetic field of the system of magnets. The direction of the magnetization of the magnets is perpendicular to the carrier 11, that of the N magnets being directed towards the second part 20 and that of the Z magnets away from the second part, as is indicated with arrows. The magnetic flux density of the system of magnets repeats itself periodically in accordance with $B(x) = B(x+2\tau)$, with $\tau$ being the magnetic pole pitch which is defined as the interspacing between the center points 13 and 14 of two mutually adjoining magnets of different kinds (N and Z). In the X-direction, i.e. perpendicularly to the current conductors 24, the magnetic flux varies sinusoidally in accordance with $$\Phi = \sin\frac{\pi(x+x_0)}{2\tau}.$$

The current conductors are supplied from a multi-phase system, a 3-phase system in the present example.

As was discussed in the description of the prior art with reference to FIG. 8, current distribution (commutation) in the current conductors for the purpose of obtaining a constant force $F_x$ also leads to local forces $F_z$ which generate an undesired torque. According to the invention, each coil block unit comprises two or more coil blocks. In the example of FIG. 1, there are two coil blocks 24a and 24b with current conductors 23 which all have the same orientation, in this example in the Y-direction. According to the invention, furthermore, the coil blocks 24a and 24b are positioned relative to one another such that the distance between the mass center points $M_1$ and $M_2$ of two mutually adjoining coil blocks 24a and 24b is substantially equal to $$\frac{\tau}{k} + p \times \tau,$$

with k=2 (two coil blocks), and p=2, 3, 4, . . . In this example, p was chosen to be equal to 2. The distance between the coil blocks 24a and 24b is therefore $$\frac{\tau}{2} + 2 \times \tau = 2\frac{1}{2}\tau.$$

The torques $M_{y1}$ and $M_{y2}$ have the same magnitude and eliminate one another in that the two coil blocks are positioned at this distance from one another. The torques have opposite directions, so that no or substantially no resulting torque is acting on the coil block unit 22 any more, and accordingly there will be no or substantially no rocking movements any more.

The linear displacement device of FIG. 2 differs from that of FIG. 1 only in that the factor p is equal to 3 now. This means that the distance between the coil block 24a and 24b is 3½τ in this case.

FIG. 3 shows a planar arrangement of a displacement device in plan view. The first part 110 is formed by a system of magnets 112 fastened on a carrier 111. The carrier is not visible in this Figure. The magnets of the system are arranged in a pattern of rows and columns which are mutually perpendicular. The rows and columns enclose an angle of approximately 45° with the X- (or Y-)direction. Each row and each column contains alternately magnets of a first kind N with a magnetization direction perpendicular to the carrier 111, i.e. perpendicular to the plane of drawing, and also directed towards the second part 120, the moving part, and magnets of a second kind Z with a magnetization direction also perpendicular to the carrier 111, but directed away from the second part 120. The magnetic pole pitch τ is defined as the distance between two mutually adjoining diagonal lines 115 and 116 on which center points 113 and 114 of magnets of the same kind (N or Z) are situated. The second part 120 has a system of electric coils 121 with four coil block units 122a, b, c, d. Each coil block unit in its turn comprises two (k=2) coil blocks 124a and 124b situated next to one another and each comprising six current conductors 123 which lie in the magnetic field of the system of magnets. The current conductors 123 of the coil block units 122a and 122c extend in the Y-direction, whereas the current conductors 123 of the coil block units 122b and 122d extend in the X-direction. Commutation of the current through the current conductors enables the moving part 120 to move through the entire X-Y plane above the system of magnets in a controlled manner. The Lorentz forces exerted on the coil block units 122a and 122c cause a movement in the X-direction, and the Lorentz forces exerted on the coil block units 122b and 122d cause a movement in the Y-direction. The distance between the mass center points $M_1$ and $M_2$ of the coil blocks 124a and 124b of each coil block unit is equal to 2½τ, as in the example of FIG. 1.

FIG. 4 shows an example of a linear displacement device in which the first part 210 is formed by a carrier 211 on which a system of magnets 212 is fastened. The system of magnets is formed by magnets of a first kind N, a second kind Z, and a third kind H. The magnets of the third kind H, the so-called Halbach magnets, are positioned such that a magnet of the third kind H is present each time between a magnet of the first kind N and of the second kind Z. The magnetization direction of the H magnets is parallel to the X-direction, towards the N magnets and away from the Z magnets. A system of magnets in which H magnets are arranged in this manner leads to an intensification of the magnetic field. The magnetic pole pitch τ is the distance between the center points 213 and 214 of two mutually adjoining magnets of the first kind N and the second kind Z. The second, moving part 220 comprises a system of coils 221 with one coil block unit 222 consisting of three coil blocks 224a, 224b, and 224c (k=3). The interspacings of the mass center points $M_1$, $M_2$, $M_3$ are equal to $$\frac{\tau}{3} + 2 \times \tau = 2\frac{1}{3}\tau \text{ (with } p = 2\text{)}.$$

The coil blocks belonging to one coil block unit were situated next to one another in the examples discussed above. This, however, need not necessarily be the case. The coil blocks belonging to a coil block unit in a planar arrangement may alternatively lie staggered relative to one another or lie in a combination of staggered and next to one another. FIGS. 5 to 7 show a few examples of this.

In FIG. 5, the coil blocks 324a and 324b belong to the coil block unit 322a, and the coil blocks 324c and 324d belong to the coil block unit 322b. The interspacings between the mass center points of the two pairs of coil blocks are, for example, 2½τ.

FIG. 6 shows four coil block units 422a to 422d, each having two coil blocks of equal orientation. Coil blocks 424a and 424b belong to coil block unit 422a, coil blocks 424c and 424d to coil block unit 422b, coil blocks 424e and 424f to coil block unit 422c, and coil blocks 424g to 424h to coil block unit 422d. All coil blocks lie staggered relative to one another. The interspacings of the mass center points of the coil blocks 424a and 424b; and 424c and 424d are chosen to be 2½τ while the interspacings between the coil blocks 424e and 424f; and 424g and 424h are chosen to be 7½τ.

FIG. 7 shows four coil block units 522a to 522d, each having three coil blocks 524a to 524c, 524d to 524f, 524g to 524i, and 524j to 524l, respectively, lying together two by two and having the same orientation. The interspacings between the mass center points of all coil blocks belonging together were chosen to be 2⅓τ here. According to the invention, however, this might also have been, for example, 3⅓τ.

It will be obvious that many combinations are possible within the scope of the invention. The basic idea is that for each coil block at least one second coil block of the same orientation is found which lies at a defined distance from the former such that the undesired torques cancel one another out. Such coil blocks will then belong to one and the same coil block unit.

The invention is also applicable when the current conductors are supplied by a 2-phase or a 4-phase system, generally speaking by a multi-phase system.

What is claimed is:

1. A displacement device with a first part and a second part which are displaceable relative to one another in at least two directions, said first part comprising a carrier which extends substantially parallel to a displacement direction and on which a system of magnets is fastened in accordance with a pattern, the pattern comprising magnets of a first kind (N) with a magnetization direction perpendicular to the carrier and directed towards the second part and magnets of a second kind (Z) with a magnetization direction perpendicular to the carrier and directed away from the second part are arranged so as to alternate with one another, which system of magnets has a magnetic flux density which repeats itself in accordance with B(x)=B(x+2τ), in which τ is the magnetic pole pitch, the second part is provided with an electric coil system with at least one coil block unit comprising a group of k coil blocks, with k≧2, which coil blocks have current conductors which are situated in a magnetic field of the system of magnets, all current conductors belonging to a single coil block unit being oriented in the same direction and being fed by an n-phase system, with n≧2, while furthermore the magnets of the magnetic system are arranged such that, viewed in a direction perpendicular to the current conductors, the flux of the magnetic system varies substantially sinusoidally in accordance with $$\Phi = \sin\frac{\pi(x + x_0)}{2\tau},$$

characterized in that, for all coil blocks belonging to one coil block unit, the distance between mass centers of consecutive coil blocks, viewed in a direction perpendicular to the conductors, is substantially equal to $$\frac{\tau}{k} + p \times \tau, \text{ with } p = 2, 3, \ldots .$$

2. A displacement device as claimed in claim 1, characterized in that the parts are displaceable relative to one another in an X-direction, the magnets of the different kinds extending alternately and substantially exclusively in the X-direction, while the magnetic pole pitch τ is defined as the distance between center points of two mutually adjoining magnets of different kinds (N and Z), and the current conductors of the coil blocks are oriented substantially perpendicularly to the X-direction.

3. A displacement device as claimed in claim 1, characterized in that the parts are displaceable relative to one another in an X-direction and/or in a Y-direction perpendicular to the X-direction, the magnets of the system of magnets of the first part being arranged in accordance with a pattern of rows and columns perpendicular thereto and enclosing an angle of 45° with the X-direction, while magnets of a first kind (N) with a magnetization direction perpendicular to the carrier and directed towards the second part and magnets of a second kind (Z) with a magnetization direction perpendicular to the carrier and directed away from the second part are arranged in each row and in each column alternately, the magnetic pole pitch τ being defined as the distance between two mutually adjoining diagonal lines on which center points of magnets of the same kind (N or Z) are situated, and the coil system of the second part comprises at least two coil block units, current conductors of at least one of said coil block units being oriented in the X-direction and of the other coil block units in the Y-direction.

4. A displacement device as claimed in claim 2, characterized in that a magnet of a third kind (H) with a magnetization direction parallel to the X-Y plane and directed towards the magnet of the first kind (N) is present between each magnet of the first kind (N) and of the second kind (Z).

* * * * *